US006566220B2

(12) United States Patent
Engelhardt et al.

(10) Patent No.: US 6,566,220 B2
(45) Date of Patent: May 20, 2003

(54) METHOD FOR FABRICATING A SEMICONDUCTOR MEMORY COMPONENT

(75) Inventors: Manfred Engelhardt, Feldkirchen-Westerham (DE); Volker Weinrich, Paris (FR); Franz Kreupl, München (DE); Manuela Schiele, New Castle Upon (GB)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/013,234

(22) Filed: Dec. 10, 2001

(65) Prior Publication Data

US 2002/0115253 A1 Aug. 22, 2002

Related U.S. Application Data

(63) Continuation of application No. PCT/DE00/01896, filed on Jun. 9, 2000.

(30) Foreign Application Priority Data

Jun. 10, 1999 (DE) ........................................ 199 26 501

(51) Int. Cl.[7] ................................................ H01L 29/92

(52) U.S. Cl. ....................... 438/393; 438/396; 438/680; 438/627; 438/631

(58) Field of Search ............................ 438/3, 393, 396, 438/627, 631, 628, 959, 680, FOR 220, FOR 430, 239, 240, 250, 253, 190

(56) References Cited

U.S. PATENT DOCUMENTS 5,335,138 A 8/1994 Sandhu et al.
5,464,786 A 11/1995 Figura et al.
5,506,166 A 4/1996 Sandhu et al.
5,518,948 A * 5/1996 Walker
5,581,436 A 12/1996 Summerfelt et al.
5,597,756 A * 1/1997 Fazan et al.
5,786,259 A 7/1998 Kang
5,907,782 A 5/1999 Wu
5,913,129 A * 6/1999 Wu et al.
6,066,541 A * 5/2000 Hsieh et al.
6,071,809 A * 6/2000 Zhao
6,162,671 A * 12/2000 Lee et al.
6,235,636 B1 * 5/2001 Ng et al.
6,262,478 B1 * 7/2001 Hurwitz et al.
6,281,540 B1 * 8/2001 Aoki
6,285,053 B1 * 9/2001 Park
6,303,523 B2 * 10/2001 Cheung et al.

FOREIGN PATENT DOCUMENTS

WO WO 99/27581 6/1999

* cited by examiner

*Primary Examiner*—Olik Chaudhuri
*Assistant Examiner*—Joannie Adelle Garcia
(74) *Attorney, Agent, or Firm*—Laurence A. Greenberg; Werner H. Stemer; Ralph E. Locher

(57) ABSTRACT

The invention relates to a method for fabricating a semiconductor memory component, in particular a DRAM or FeRAM having a silicon substrate. The lower electrode of a storage capacitor is insulated from the silicon substrate by a barrier layer. The barrier layer is patterned using a hard mask, in particular, made from $SiO_2$, SiN, SiON, before the storage capacitor is applied, and the mask layer which remains after the patterning is removed so as to uncover the patterned barrier layer. The invention provides for the patterned barrier layer to be embedded in $SiO_2$ by means of CVD (chemical vapor deposition) prior to the removal of the remaining mask layer, and for the remaining mask layer, together with the $SiO_2$ embedding, to be removed from the surface of the barrier layer using an $SiO_2$-CMP (chemical mechanical polishing) process.

12 Claims, 2 Drawing Sheets

9
8
7
2

METHOD FOR FABRICATING A SEMICONDUCTOR MEMORY COMPONENT

CROSS-REFERENCE TO RELATED APPLICATION

This application is a continuation of copending International Application No. PCT/DE00/01896, filed Jun. 9, 2000, which designated the United States.

BACKGROUND OF THE INVENTION

Field of the Invention

The present invention relates to a method for fabricating a semiconductor memory component that includes a barrier layer that insulates the lower electrode of a storage capacitor from a silicon substrate. The method includes steps of: applying a barrier layer; patterning the barrier layer prior to applying a storage capacitor with a hard mask; and removing the hard mask that remains after the patterning so as to uncover the patterned barrier layer. A method including these steps is known, for example, from U.S. Pat. Nos. 5,464,786, 5,506,166, and U.S. Pat. No. 5,581,436.

Furthermore, it is known from International Publication WO 99/27581 to provide an insulation layer, with a contact plug inside it, on a substrate. A dielectric with a recess is formed on the insulation layer, and a barrier layer is provided on this structure as a diffusion barrier. Then, a lower electrode layer, a dielectric layer and an upper electrode layer for a storage capacitor are deposited. Next, a buffer layer, which covers the structure and fills up the remaining recess, is deposited. Finally, in a chemical mechanical planarization step, the buffer layer is eroded down to the barrier layer, and then the barrier layer which has been uncovered at the surface is removed.

The corresponding semiconductor memory components include at least one storage capacitor having a storage medium that includes a ferroelectric thin film or a thin film with a high dielectric constant. When using storage media of this type, annealing processes at high temperatures are required, characteristically of the order of magnitude of 800° C., in an oxidizing environment including, in particular, a process gas of oxygen. Material diffusion processes, for example, through partial oxidation of polysilicon plugs, which are used to make contact with the silicon substrate, must be avoided, since they may impair the semiconductor memory component or even cause it to fail.

To prevent material diffusion processes, diffusion barriers or sandwiches of such barriers in combination with adhesion layers, for example, consisting of Ir, $IrO_2$, IrO, are used. In the text which follows, these structures are referred to overall as barriers or barrier layer. These barriers are arranged between the storage capacitor and the silicon substrate. For example, the lower electrode, known as the bottom electrode of the storage capacitor, which typically consists of Pt, Ru, $RuO_2$, is applied to the barrier layer. To ensure optimum adhesion of the lower electrode to the barrier, the barrier layer must have a planar contact face which is as large as possible. Moreover, the lowest possible contact resistance is required, especially as electrode thin films usually exhibit poor adhesion to the silicon substrate.

The barrier layers can only be patterned with difficulty in the plasma, since they form insufficient or nonvolatile compounds in the process chemistry used to transfer the pattern. Therefore, the patterning has hitherto preferably been carried out by physical sputtering removal of the layers. Consequently, low selectivities with respect to mask materials are achieved during the transfer of the pattern. Moreover, in the case of a barrier layer made from $IrO_2$, the oxygen which is released additionally contributes to the removal of the resist. Moreover, the transfer of the pattern leads to a significant change in the CD (critical dimension) and/or to beveled profiles. These beveled profiles are caused by the resist being drawn back in the lateral direction, or by the accumulation of redepositions on the side walls of the pattern that is produced, or from a combination of the two. The redepositions can only be removed with difficulty, if at all.

Moreover, in combination with the application of storage capacitors to a silicon substrate, it is known to use a dielectric hard mask which consists, for example, of $SiO_2$, SiN or SION. Since in principle these mask layers are more difficult to erode, higher selectivities can be achieved during a process that uses these mask layers. However, because of the mask beveling that occurs during physical sputtering erosion in the plasma patterning process, the thickness of the mask layer has to be selected to be greater than the thickness which would be required purely through the selectivity, in order to prevent the bevel from being transferred into the layer which is to be patterned. The removal of the mask that remains after the pattern has been transferred, in a plasma etching process, leads to an additional increase in the desired topography of at least the thickness of the mask layer which is to be removed.

Patterning processes of this type are known, for example, from U.S. Pat. Nos. 5,464,786, 5,506,166, 5,581,436. Wet processes for the subsequent erosion of the mask layer are fundamentally unsuitable, on account of the associated additional isotropic undercut etching of the patterns.

SUMMARY OF THE INVENTION

It is accordingly an object of the invention to provide a method for fabricating a semiconductor memory component that includes a barrier layer that insulates the lower electrode of a storage capacitor from a silicon substrate, which overcomes the above-mentioned disadvantages of the methods of this general type.

In particular, it is an object of the present invention to provide a method of the type described in the introduction which ensures an optimally large surface area or adhesion surface for the barrier layer with respect to the lower electrode of the storage capacitor.

With the foregoing and other objects in view there is provided, in accordance with the invention, a method for fabricating a semiconductor memory component having a silicon substrate. The method includes steps of: configuring a barrier layer on a silicon substrate; patterning the barrier layer using a hard mask to obtain a patterned barrier layer prior to configuring a storage capacitor on the substrate; embedding the patterned barrier layer and the hard mask that remains above the patterned barrier layer in an embedding layer; performing a chemical mechanical polishing step to remove the hard mask that remains above the patterned barrier layer, to remove the embedding layer that is above the patterned barrier layer, and to thereby uncover the patterned barrier layer; configuring the storage capacitor on the substrate such that a lower electrode of the storage capacitor is insulated from the silicon substrate by the barrier layer; and constructing the storage capacitor with an upper electrode and with a dielectric layer that is located between the lower electrode and the upper electrode.

In accordance with an added feature of the invention, the chemical mechanical polishing step is stopped at the surface of the barrier layer.

In accordance with an additional feature of the invention, the semiconductor memory component is used in a DRAM or a FeRAM.

In accordance with another feature of the invention, a ferroelectric material is used for the dielectric layer.

In accordance with a further feature of the invention, the barrier layer is designed as either a diffusion barrier or a diffusion barrier sandwich in combination with adhesion layers.

In accordance with a further added feature of the invention, the adhesion layers are made from Ir, $IrO_2$, or IrO.

In accordance with a further additional feature of the invention, the hard mask is made from $SiO_2$, SiN, or SiON.

In accordance with yet an added feature of the invention, the embedding layer is made from $SiO_2$ by chemical vapor deposition.

In accordance with a concomitant feature of the invention, the method includes steps of: providing an insulation layer on the substrate; providing a contact plug in the insulation layer;

and providing the barrier layer on the insulation layer as a diffusion barrier.

In other words, the invention provides for the patterned barrier layer, together with the mask layer remaining on it, to be completely embedded in $SiO_2$ using a CVD (chemical vapor deposition) process. This is followed by a CMP (chemical mechanical polishing) process, in which the polishing is advantageously stopped at the contact face of the barrier layer. These process steps ensure that the surface areas or contact faces (also known as the critical dimensions (CD)) of the barrier layers undergo a minimal change by producing perpendicular side walls on account of a hard mask that is used for transferring the pattern. Optimum adhesion of the storage capacitor, with low contact resistance, is ensured by means of the resulting large-area, planar contact face for the lower electrode that will be applied thereto, without producing an additional topography, because of the inventive combination of CVD-$SiO_2$ and $SiO_2$-CMP.

A further advantage of the inventive method is that the uncovered contact face of the barrier layer is embedded in a surrounding $SiO_2$ layer, with the exception of its surface or contact face. A structure of this type with a buried barrier layer results from the inventive procedure using CVD-$SiO_2$ and $SiO_2$-CMP.

Other features which are considered as characteristic for the invention are set forth in the appended claims.

Although the invention is illustrated and described herein as embodied in a method for fabricating a semiconductor memory component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
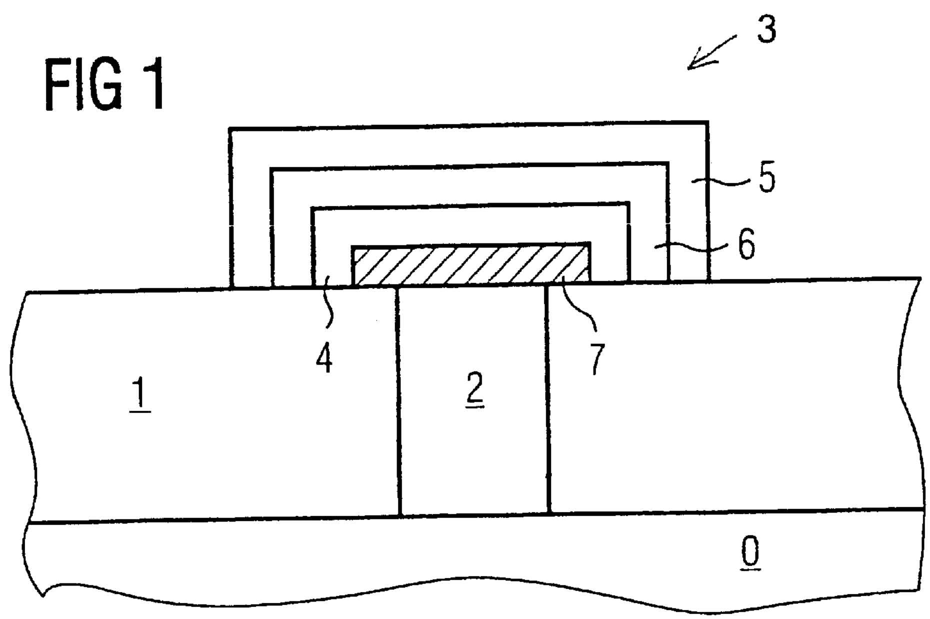
FIG. 1 is a diagrammatic cross-sectional view of a semiconductor memory component in the region of a storage capacitor.

Referring now to the figures of the drawing in detail and first, particularly, to FIG. 1 thereof, there is diagrammatically shown a storage capacitor 3 arranged on a substrate 0. The storage capacitor 3 includes a lower electrode 4, known as a bottom electrode, an upper electrode 5, known as a top electrode, and a dielectric 6 or a storage medium that is arranged between the two electrodes and includes a ferroelectric thin film or a thin film with a high dielectric constant. The substrate 0 is coated with, for example, $SiO_2$, in the region of a plug 2, which is formed at that location in the customary way from poly-Si, W and the like. The plug 2 extends as far as the top side of the $SiO_2$ layer 1. To prevent the problem of material diffusion, which was dealt with in the introduction, a barrier layer 7 is arranged between the lower electrode 4 and the top side of the $Sio_2$-coated substrate.

Figure 2A:
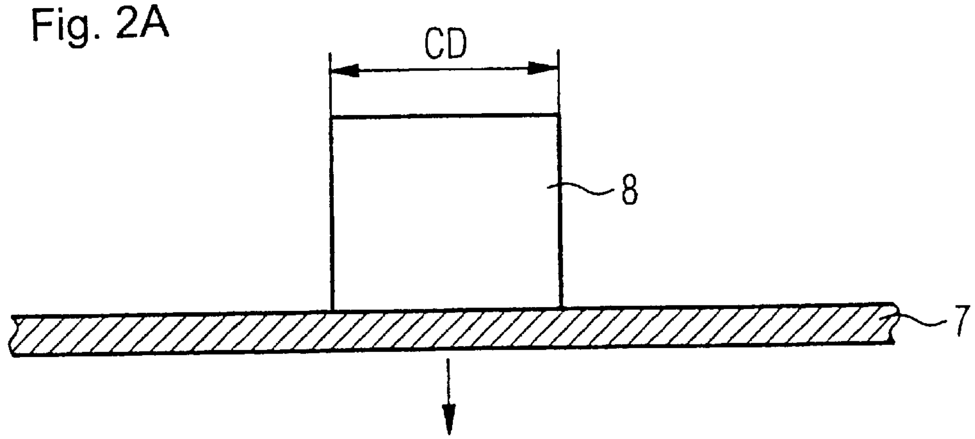
FIG. 2A shows a prior art process for fabricating the barrier layer in the configuration shown in FIG. 1, after the application of the resist.
Figure 2B:
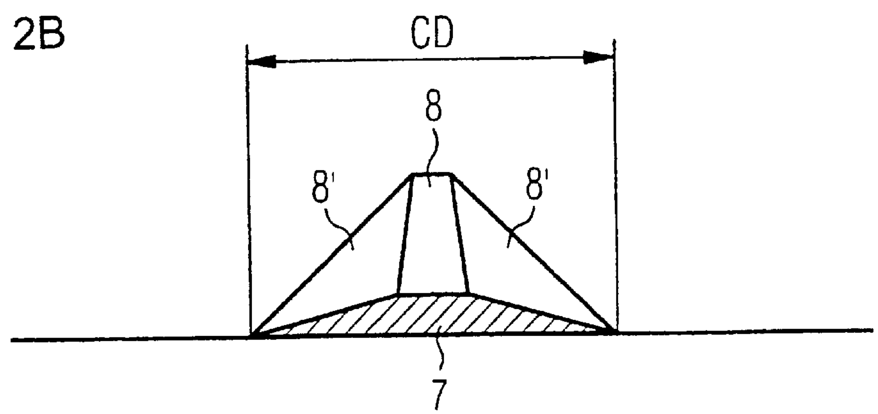
FIG. 2B shows the process for fabricating the barrier layer after transfer of the pattern has taken place.

A conventional process sequence producing the barrier layer 7 is diagrammatically depicted in FIGS. 2A and 2B, in which the substrate has not been illustrated. Accordingly, in a known way a resist mask 8 is applied to the top side of the barrier layer 7. The mask, because of its structure, has covering regions with a defined surface extent (with CD=critical dimension). This arrangement is shown in FIG. 2A. FIG. 2B shows the arrangement after patterning the barrier layer 7 with the remaining resist mask 8. It is clear that the surface or CD of the resist mask 8 has changed considerably. Sloping flanks of the resist mask often remain as a result of redepositions 8'. In a similar way, the barrier layer 7 that remains below the resist mask has a reduced planar surface with sloping flanks.

Figure 3A:
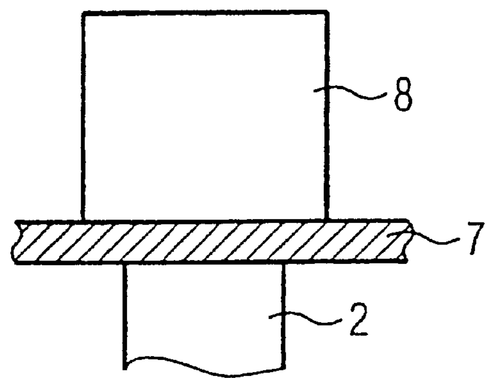
FIGS. 3A and 3B show the process using a hard mask.
Figure 3B:
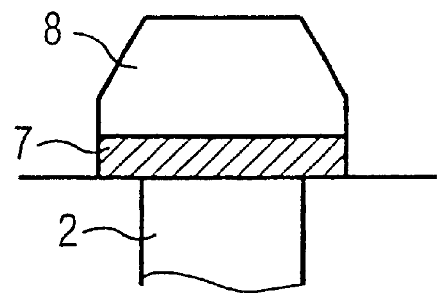

The unfavorable beveling of the barrier layer 7 that is produced with this conventional method is avoided by using a hard mask, which is likewise denoted by 8, and is as diagrammatically depicted in FIGS. 3A and 3B. FIG. 3A shows the state of the arrangement prior to the etching and FIG. 3B shows the state of the arrangement after the etching. If wet processes are subsequently applied to the process state illustrated by FIG. 3B, in order to remove the hard mask 8, additional isotropic undercut etching of the patterns has to be expected.

Figure 3C:
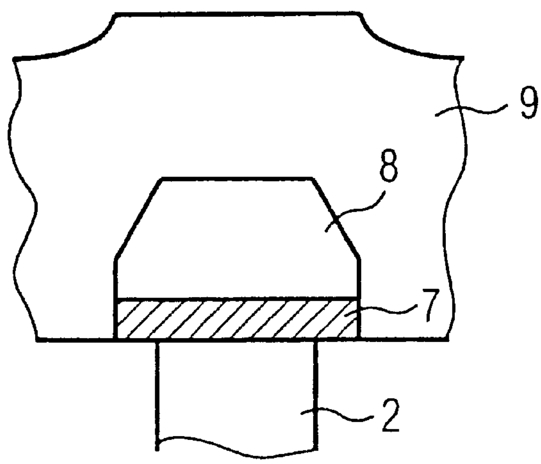
FIGS. 3C and 3D show the process using CVD-$SiO_2$ (FIG. 3C) and $SiO_2$-CMP (FIG. 3D)
Figure 3D:
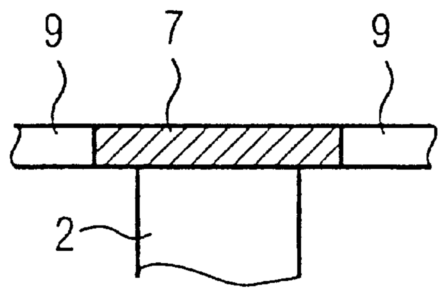

According to the invention, this drawback is avoided by the process sequence illustrated in FIG. 3C and FIG. 3D. As shown in FIG. 3C, the patterned barrier layer 7 together with the mask layer 8 remaining on it is embedded in $SiO_2$ using a CVD process. The $Sio_2$ embedding layer is denoted by reference numeral 9. This is followed, as shown in FIG. 3D, by a CMP process with the polishing stopping at the surface of the barrier layer 7. The CMP process completely removes the hard mask 9 from the barrier layer 7, while leaving a large-area planar surface or contact face. The lower electrode layer 4 of the storage capacitor 3 is subsequently applied to the planar surface or contact face with good adhesion and without producing additional topography.

We claim:

1. A method for fabricating a semiconductor memory component having a silicon substrate, which comprises:

configuring a barrier layer on a silicon substrate;

patterning the barrier layer using a hard mask to obtain a patterned barrier layer prior to configuring a storage capacitor on the substrate;

embedding the patterned barrier layer and the hard mask that remains above the patterned barrier layer in an embedding layer;

performing a chemical mechanical polishing step to remove the hard mask that remains above the patterned barrier layer, to remove the embedding layer that is above the patterned barrier layer, and to thereby uncover the patterned barrier layer;

configuring the storage capacitor on the substrate such that a lower electrode of the storage capacitor is insulated from the silicon substrate by the barrier layer; and constructing the storage capacitor with an upper electrode and with a dielectric layer that is located between the lower electrode and the upper electrode.

2. The method according to claim 1, which comprises stopping the chemical mechanical polishing step at a surface of the barrier layer.

3. The method according to claim 2, in combination with a method of using the semiconductor memory component, which comprises using the semiconductor memory component in a memory selected from the group consisting of a DRAM and an FeRAM.

4. The method according to claim 2, which comprises using a ferroelectric material for the dielectric layer.

5. The method according to claim 1, in combination with a method of using the semiconductor memory component, which comprises using the semiconductor memory component in a memory selected from the group consisting of a DRAM and an FeRAM.

6. The method according to claim 5, which comprises using a ferroelectric material for the dielectric layer.

7. The method according to claim 1, which comprises using a ferroelectric material for the dielectric layer.

8. The method according to claim 1, which comprises designing the barrier layer as a barrier selected from the group consisting of a diffusion barrier and a diffusion barrier sandwich in combination with adhesion layers.

9. The method according to claim 1, which comprises:

designing the barrier layer as a diffusion barrier sandwich in combination with adhesion layers; and making the adhesion layers from a material selected from the group consisting of Ir, $IrO_2$, and IrO.

10. The method according to claim 1, which comprises making the hard mask from a material selected from the group consisting of $SiO_2$, SiN, and SION.

11. The method according to claim 1, which comprises producing the embedding layer from $SiO_2$ by chemical vapor deposition.

12. The method according to claim 1, which comprises:

providing an insulation layer on the substrate;

providing a contact plug in the insulation layer; and providing the barrier layer on the insulation layer as a diffusion barrier.

* * * * *